United States Patent [19]

Ozawa

[11] Patent Number: 5,742,275

[45] Date of Patent: Apr. 21, 1998

[54] APPARATUS AND METHOD FOR DISPLAYING A SIGNAL WAVEFORM

[75] Inventor: Kentaro Ozawa, Kanagawa-ken, Japan

[73] Assignee: Leader Electronics Corp., Kanagawa, Japan

[21] Appl. No.: 305,708

[22] Filed: Sep. 14, 1994

[30] Foreign Application Priority Data

Sep. 14, 1993 [JP] Japan .................................. 5-229026

[51] Int. Cl.⁶ .................................................. G09G 5/36
[52] U.S. Cl. ........................................... 345/134; 345/145
[58] Field of Search ................................ 345/145, 134, 345/140, 127, 131; 324/121 R; 364/474.22, 474.26

[56] References Cited

U.S. PATENT DOCUMENTS

| | | | |
|---|---|---|---|
| 4,628,254 | 12/1986 | Bristol | 324/121 R |
| 4,751,504 | 6/1988 | Slavin . | |
| 5,039,937 | 8/1991 | Mandt et al. | 324/121 R |
| 5,047,709 | 9/1991 | Fundak . | |

FOREIGN PATENT DOCUMENTS

| | | | |
|---|---|---|---|
| 5-10976 | 1/1993 | Japan | 324/121 R |
| 5-5754 | 1/1993 | Japan | 324/121 R |

*Primary Examiner*—Richard Hjerpe
*Assistant Examiner*—Vui T. Tran
*Attorney, Agent, or Firm*—Fish & Richardson P.C.

[57] ABSTRACT

An apparatus for displaying a waveform of an input signal on a display includes a synchronization detecting circuit, a sweep generating circuit, a horizontal axis drive circuit, a switching circuit, a variable gain amplifier, a vertical axis drive circuit, and a vertical location arrangement circuit. The horizontal axis drive circuit drives the horizontal axis of the display on the basis of a sweep signal generated at the sweep generating circuit synchronously with a sweep trigger signal obtained by dividing synchronization detecting pulses from the synchronization detecting circuit by N (N=1, 2, ... ). The switching circuit alternately transfers the input signal and a cursor signal at a high rate to provide a multiplexed input/cursor signal to the vertical axis drive circuit through the variable gain amplifier. The vertical location arrangement circuit generates a vertical location arrangement signal stepwisely variable synchronously with the sweep trigger signal to the vertical axis drive circuit, where the multiplexed input/cursor and vertical location arrangement signals are combined to provide a vertical axis drive signal. Accordingly at least two sliced portions of the waveform with the cursors are displayed on the left and right sides of the display in an enlarged/divided display mode (N≥2), and the whole waveform with the cursors is displayed on the display in a normal display mode (N=1).

1 Claim, 5 Drawing Sheets

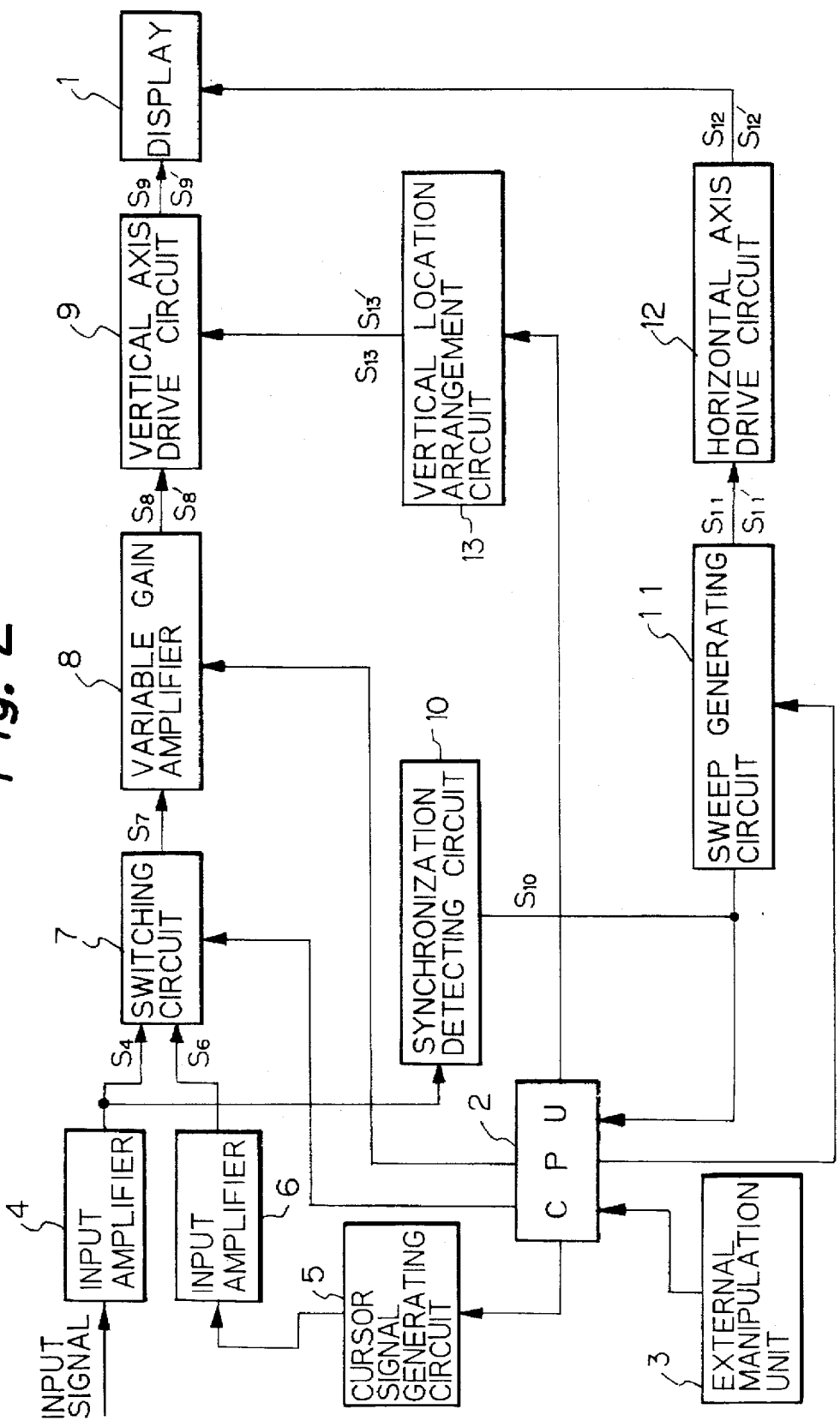

Fig. 3(A)  S4  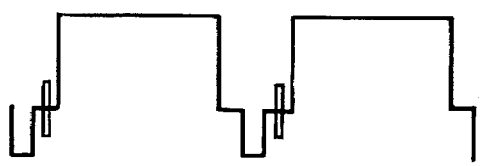
Fig. 3(B)  S6  
Fig. 3(C)  S7  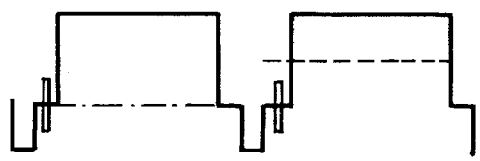
Fig. 3(D)  S8  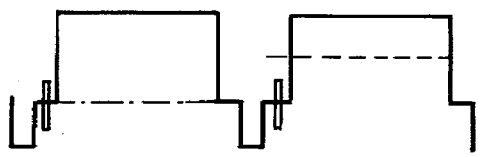
Fig. 3(E)  S9  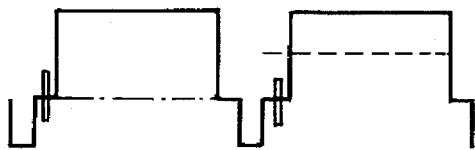
Fig. 3(F)  S10  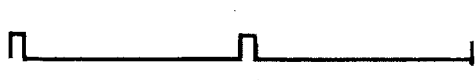
Fig. 3(G)  S11  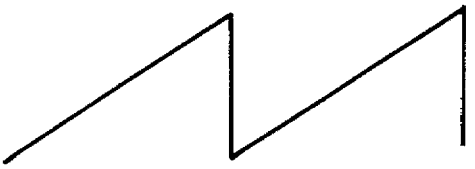
Fig. 3(H)  S12  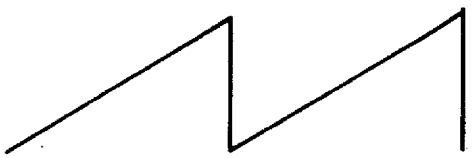
Fig. 3(I)  S13  V1

Fig. 4 (A) $S_8'$ 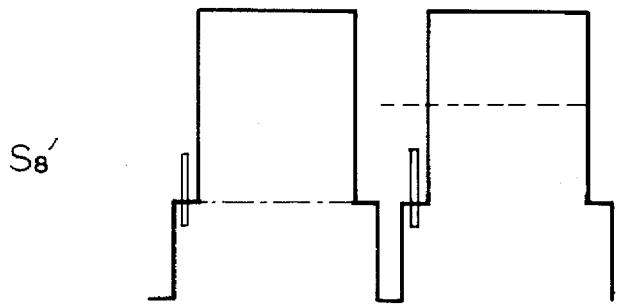
Fig. 4 (B) $S_9'$ 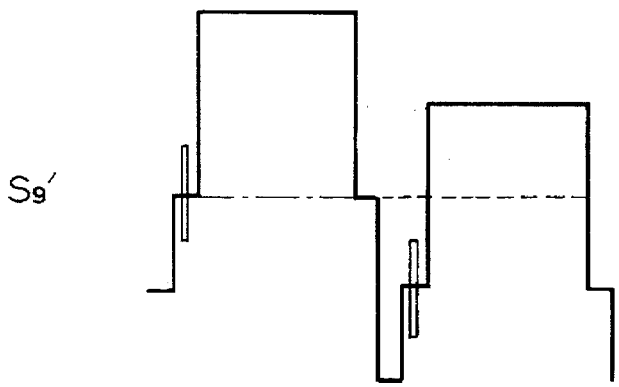
Fig. 4 (C) $S_{10}$ 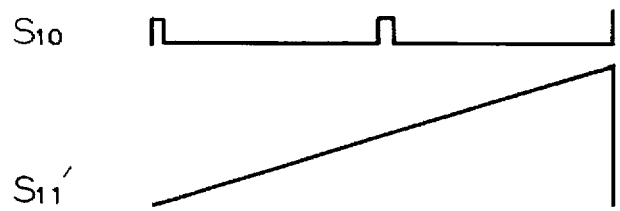
Fig. 4 (D) $S_{11}'$ 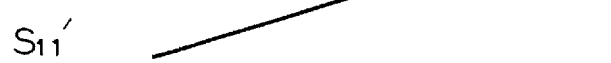
Fig. 4 (E) $S_{12}'$ 
Fig. 4 (F) $S_{13}'$ 

APPARATUS AND METHOD FOR DISPLAYING A SIGNAL WAVEFORM

BACKGROUND OF THE INVENTION

1. Field of the Invention

This invention relates to an apparatus and method for displaying an input signal waveform and, in particular, relates to an apparatus for displaying the pedestal and top portions of a waveform of an input signal on a display screen even if the amplitude of the input signal is multiplied to obtain improved resolution in the display screen.

2. Description of the Related Art

FIG. 1(A) illustrates a display screen DS wherein a signal waveform on a horizontal line of a video signal is schematically shown. When it is required to measure a voltage difference between pedestal and white levels of the video signal, a reference cursor $K_{REF}$ is adjusted to be located at the pedestal level and a delta cursor $K_{DELT}$ is adjusted to be located at the white level, thereby the difference level between the cursors, and hence between the pedestal and white levels of the video signal may be numerically displayed on the screen. In this case, since a magnification ratio of the video signal is low, for example "1", it is sometimes probable that the reference cursor $K_{REF}$ and the delta cursor $K_{DELT}$ will only be locatable in the neighborhood of the pedestal and white levels of the video signal. Thus, in such a case, a magnitude of the video signal is multiplied or amplified by a factor larger than "1" and then the amplified waveform is displayed on the screen DS to improve the resolution so that the cursors $K_{REF}$ and $K_{DELT}$ are precisely located at the pedestal and white levels of the video signal.

When the magnitude of the video signal is multiplied by a certain factor and displayed, the higher level portion of the signal waveform is usually off the screen DS together with the delta cursor $K_{DELT}$ as shown in FIG. 1(B). Therefore, after the precise location of the reference cursor $K_{REF}$ at the pedestal level is executed as shown in FIG. 1(B), the screen must be scrolled by means of a vertical location arranger to reenter the delta cursor $K_{DELT}$ in the screen DS together with the higher level portion of the waveform, as shown in FIG. 1(C), thereby the delta cursor $K_{DELT}$ is able to be accurately located at the white level. Further, since only one of the two cursors can be displayed on the same screen, it is impossible to observe on the screen DS when the cursor located off the screen is moved from the pedestal or white level of the video signal from a precise location. Thus, when it is necessary to know the precise location of the off-screen cursor, scrolling must be carried out which makes the operation complicated. This problems may be caused on signals other than the video signal.

SUMMARY OF THE INVENTION

The present invention overcomes the above mentioned problem and provides an apparatus and method that make it possible to simultaneously display at least lower and upper portions of a waveform of an input signal on the same display screen even if the multiplicity ratio of the display image is increased.

The present invention also provides an apparatus and method that make it possible to simultaneously display at least lower and upper portions of a waveform of an input signal with reference and delta cursors on the same screen even if the multiplicity ratio of the display image is increased, thereby it is possible to accurately measure the difference between the pedestal and top levels of the input signal because precisely positioning of the cursors on the pedestal and top portions of the displayed waveform can be carried out.

A signal waveform display apparatus in accordance with the present invention comprises: (a) means (10) for generating a synchronization detecting pulse synchronously with a synchronous signal incorporated in the input signal; (b) means (11) for generating a sweep signal synchronously with a sweep trigger pulse obtained by dividing the synchronization detecting pulses by N, where N is an integer; (c) means (12) for driving a horizontal axis of the display screen on the basis of said sweep signal; (c) variable gain amplifier means (8) for amplifying the input signal; (d) means (13) for generating a vertical location arrangement signal to arrange reference display locations on a vertical axis for the waveform of the input signal, the vertical location arrangement signal being stepwisely variable synchronously with the sweep trigger signal; and (e) means (9) for combining the vertical location arrangement signal and the input signal which has been amplified with the variable gain amplifying means to obtain a vertical axis drive signal and for driving a vertical axis of the display screen on the basis of the vertical axis drive signal, thereby at least two sliced portions of the waveform of the input signal being displayed on the left and right sides of the same display screen in an enlarged/divided display mode ($N \geq 2$), and the whole waveform being displayed on the display screen in a normal display mode (N=1).

In a preferred embodiment of the present invention, the apparatus further comprises: control means (2) for controlling the operation of the apparatus; and means (3) for manipulating by an user to input the values of N and gain of the variable gain amplifier through the control means to the sweep signal generating means and vertical location arrangement means.

An input signal waveform display method according to the present invention comprises the steps of: (a) generating a synchronization detecting pulse synchronously with a synchronous signal incorporated in the input signal; (b) generating a sweep signal synchronously with a sweep trigger signal obtained by dividing the synchronization detecting pulses by N, where N is an integer; (c) amplifying the input signal at a given gain; (d) generating a vertical location arrangement signal to arrange reference display locations on a vertical axis for the waveform of the input signal, the vertical location arrangement signal being stepwisely varied synchronously with the sweep trigger signal; (e) combining said vertical location arrangement signal and the input signal which has been amplified with the gain to obtain a vertical axis drive signal; (f) driving a horizontal axis of the display screen on the basis of the sweep signal; (g) driving a vertical axis of the display screen on the basis of the vertical axis drive signal; and (h) displaying at least two sliced portions of the waveform of the input signal being displayed on the left and right sides of the same display screen in an enlarged/divided display mode ($N \geq 2$), or the whole waveform of the input signal on the display screen in a normal display mode (N=1).

In a preferred embodiment of the present invention, the method further comprises the step of: varying the gain for amplification of the input signal; and adjusting the levels of the vertical location arrangement signal stepwisely varied to display the pedestal and top levels of the waveform on the same display screen.

Further, in the another aspect of present invention, reference and delta cursors also can be displayed to measure the difference between pedestal and top levels of the input signal on a display screen by multiplexing the input signal and a cursor signal before amplifying at the gain. In this case, in the enlarged/divided display mode, the displayed cursors may be precisely positioned on the pedestal and top level portions of the displayed waveform by adjusting the levels of voltages of a cursor signal.

BRIEF DESCRIPTION OF THE DRAWINGS

The detailed description of embodiments of the invention will be better understood with reference to the attached drawings, in which:

FIG. 2 shows a circuit block diagram illustrating an embodied signal waveform display apparatus in accordance with the present invention;

FIGS. 3(A)–3(I) are waveforms of signals output from respective circuits of the apparatus shown in FIG. 2 in a normal display mode where the display scale is not enlarged;

FIGS. 4(A)–4(F) are waveforms of signals output from the principal circuits of the apparatus shown in FIG. 2 in a enlarge display mode where the display scale is enlarged and the screen is divided.

DETAILED DESCRIPTION OF THE INVENTION

Figure 1A:
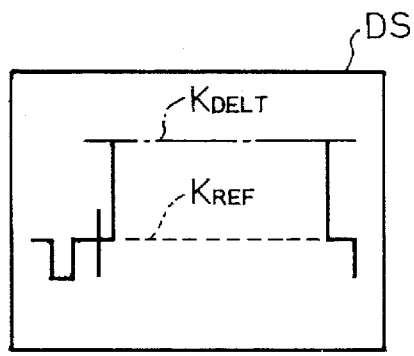
FIGS. 1(A)–1(C) illustrate displayed signal waveforms on a display screen in accordance with a prior art technique.
Figure 1B:
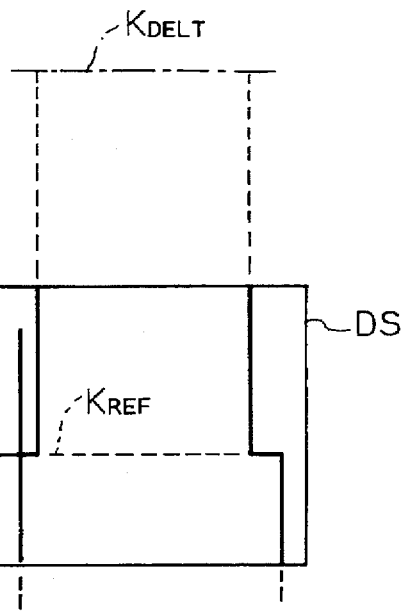
Figure 1C:
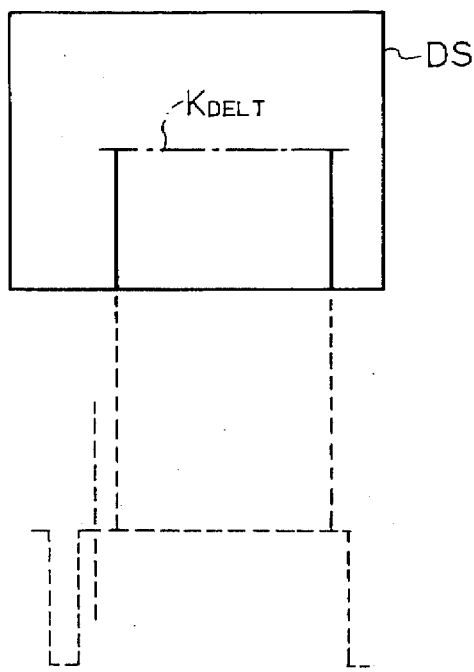

FIG. 2 shows an embodiment of a signal waveform display apparatus in accordance with the present invention. In the drawing, the numeral 1 denotes a display such as a CRT display for displaying a waveform of an input signal such as video signal, 2 a CPU for controlling the overall operation of the signal waveform display apparatus, and 3 an external manipulation unit for inputting various numerical control values as well as setting up particular modes for the CPU 2 by an user. The numeral 4 denotes a first input amplifier for amplifying the input signal, waveform of which is to be displayed on a screen of the display 1, 5 a cursor signal generating circuit for generating a cursor signal in response to an instruction from the CPU 2, and 6 a second input amplifier for amplifying the cursor signal. The cursor signal generated from the cursor signal generating circuit 5 includes two different voltage portions associated with displayed vertical locations of a reference cursor $K_{REF}$ and a delta cursor $K_{DELT}$ on the display screen, and the cursor positions are respectively capable of being vertically varied by changing the associated voltages.

The apparatus further includes a switching circuit 7 for rapidly alternatively transferring one of the output signals from the input amplifiers 4 and 6, a variable gain amplifier 8 the gain of which is controlled in response to an instructions from the CPU 2, and a vertical axis drive circuit 9 for driving the vertical axis of the display 1. The switching circuit 7 constructs means for multiplexing the input signal and the cursor signal so as to generate a multiplexed input/cursor signal. The apparatus still further includes a synchronization detecting circuit 10 for generating synchronization detection pulses by detecting synchronous signals incorporated in the signal output from the input amplifier 4, a sweep generating circuit 11 for generating a sweep signal $S_{11}$ in response to the synchronization detecting pulses, a horizontal axis driver circuit 12 for driving the horizontal axis of the screen of the display 1 in response to the sweep signal, and a vertical location arrangement circuit 12 for generating a vertical location arrangement signal in response to the instructions from the CPU 2.

The detailed operation of the apparatus mentioned above will be explained hereinafter.

First, the operation in the normal or standard mode where the display scale of the input signal is ×1 will be explained with reference to signal waveforms shown in FIGS. 3(A)–3 (I). The input amplifiers 4 outputs a signal $S_4$ as shown in FIG. 3(A) when an input signal is applied thereto. On the other hand, the input amplifier 6 outputs a signal $S_6$ as shown in FIG. 3(B) when the cursor signal generating circuit 5 outputs a cursor signal including two different voltage portions representing the locations of the reference and delta cursors $K_{REF}$ and $K_{DELT}$. These signals $S_4$ and $S_5$ are multiplexed by the switching circuit 7 under the control of CPU 2 so as to be output as a multiplexed input/cursor signal $S_7$ as shown in FIG. 3(C). The switching circuit 7 performs the switching operation between signals $S_4$ and $S_6$ so rapidly that the waveforms of the signals $S_4$ and $S_5$ included in the multiplexed input/cursor signals $S_7$ are not visibly displayed in the discontinuous manner on the display screen.

Since in the normal display mode, the gain G of the variable gain amplifier 8 is set to G=1 by a control signal from the CPU 2, a signal $S_8$ from the amplifier 8 is equal to the signal $S_7$ and is applied to the vertical axis drive circuit 9. The vertical axis drive circuit 9 is also provided with a vertical location arrangement signal $S_{13}$ at a certain reference level $V_1$, as shown in FIG. 3(I), from the vertical location arrangement circuit 13 under the control of the CPU 2. The level $V_1$ is previously set to associate with a reference position of the vertical axis. The vertical axis drive circuit 9 performs a level-shift operation so that the level of the signal $S_8$ supplied thereto is shifted by the level $V_1$ of the vertical location arrangement signal $S_{13}$, and thus the circuit 9 generates a vertical axis drive signal $S_9$ as shown in FIG. 3(E).

The synchronization detecting circuit 10 detects the synchronization signals included in the signal $S_4$ output from the input amplifier 4, to provide a synchronization detecting pulses $S_{10}$ as shown in FIG. 3(F) to the sweep generating circuit 11. Under the control of the CPU 2, the sweep generation circuit 11 generates the sweep signal $S_{11}$ as shown in FIG. 3(G) in the normal display mode, and apply the sweep signal $S_{11}$ to the horizontal axis driver circuit 12. That is, in the nominal mode, the sweep signal generating circuit 11 creates the sweep signal $S_{11}$ synchronously with the synchronization detecting pulses $S_{10}$, and thus each of the pulses $S_{10}$ acts as a trigger pulse for the sweep signal.

Figure 5:
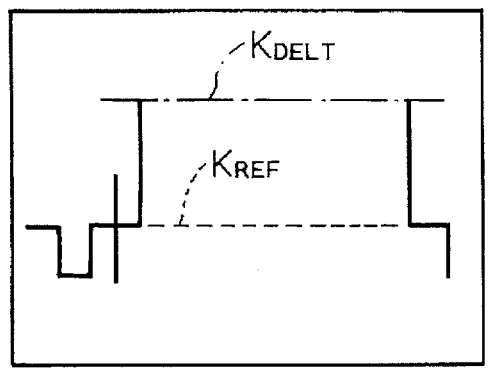
FIGS. 5(A) and 5(B) schematically show displayed waveforms on a screen in the normal and enlarge display mode respectively according to the invention.
Figure 5:
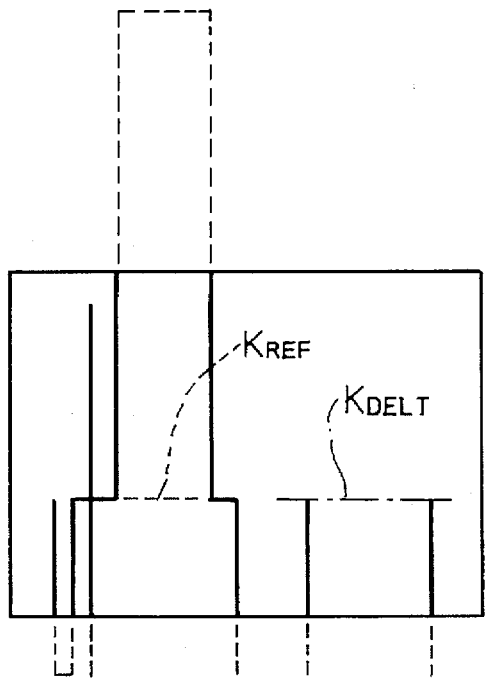

Since the vertical and horizontal axes of the display 1 are respectively driven by the vertical and horizontal axis drive signals $S_9$ and $S_{12}$ as shown in FIGS. 3(E) and 3(H), a waveform of the input signal is displayed as shown in FIG. 5(A), wherein reference and delta cursors $K_{REF}$ and $K_{DELT}$ are also displayed.

Next, the operation of the apparatus shown in FIG. 2 in the enlarged/divided display mode, where the waveform of the input signal is enlarged and horizontally divided into two parts thereby being displayed in the left and right on the screen of the display 1, will be explained in reference to waveforms shown in FIGS. 4(A)–4(F).

In this display mode, the CPU 2 controls the sweep generating circuit 11 to generate a sweep signal $S_{11'}$ synchronously with every two synchronization detecting pulses $S_{10}$ and thus one cycle of the signal $S_{11'}$ is twice as long as that of the sweep signal $S_{10}$, as shown in FIG. 4(D). In other words, pulses obtained by dividing the synchronization detecting pulses $S_{10}$ by 2 are the trigger pulses for the sweep generating circuit 11. The horizontal axis drive circuit 12 generates the horizontal axis drive signal $S_{12'}$ (shown in FIG. 4(E)) similar to the sweep signal $S_{11'}$ to drive the horizontal axis of display 1.

The CPU 2 also sets forth the gain G of the variable gain amplifier 8 as G=5 for example, which makes the combined input/cursor signal $S_7$ from the switching circuit 7 be amplified by five times to output the signal $S_{8'}$ (=5×$S_7$), as shown in FIG. 4(A). Further, the CPU 2, when it controls the operation of the sweep generating circuit so as to generate the sweep signal $S_{11'}$ synchronously with, for example, the oddly numbered synchronization detecting pulses $S_{10}$, controls the vertical location arrangement circuit 13 to generate a vertical location arrangement signal $S_{13'}$, the level of which is shifted in the negative direction from the level $V_1$ to a predetermined level $V_2$ at the time point when the even numbered synchronization detecting pulses $S_{10}$ is generated. That is, the level of the signal $S_{13'}$ is lowered from the level $V_1$ to the level $V_2$ at the middle of the cycle of the sweep signal $S_{11'}$, as shown in FIG. 4(F).

Therefore, the vertical axis driver circuit 9 generates, in the latter half of the cycle of the sweep signal $S_{11'}$, a vertical axis drive signal $S_{9'}$ the DC level of which is negatively offset by ($V_1$-$V_2$), as shown in FIG. 4(B).

Accordingly, as shown in FIG. 5(B), lower and upper portions obtained by vertically-separating the waveform of the input signal are displayed on the left and right sides of the display screen and both of the reference cursor $K_{REF}$ and delta cursor $K_{DELT}$ are simultaneously displayed on the enlarged waveform images. Therefore, by adjusting the cursor positions on the pedestal and top (or white in the video signal) levels of the displayed waveform which has been enlarged and divided into two portions, more precise positioning of the cursors can be achieved. If the upper portion of the waveform and the delta cursor $K_{DELT}$ still lie outside of the display screen, and thus they do not appear on the display screen, the amount of the negative offset ($V_1$-$V_2$) of the vertical location arrangement signal $S_{13'}$ may be set to be larger by manipulating the external manipulation unit 3 so that the upper portion is displayed on the screen. On the other hand, if the pedestal level and reference cursor $K_{REF}$ disappear, by varying the level $V_1$, they may be laid on the screen.

Although the screen is horizontally divided into two parts in the example explained above, division into three parts is also possible. In such a case, the cycle of the sweep signal $S_{11'}$ is made three times as long as that of the signal $S_4$ or $S_{11}$ (that is when the screen is not divided) and the vertical location arrangement signal $S_{13'}$ is negatively level-shifted stepwisely at the one-third and two-third points of one cycle of the sweep signal $S_{11'}$. In the case of dividing into three parts, the cycle of the signal $S_{4'}$ is three times that of the sweep signal while the cycle of the signal $S_6$ is the same as that of the signal $S_{11'}$ and two voltage levels of the signals $S_6$ corresponding to the reference and delta cursors $K_{REF}$ and $K_{DELT}$ are respectively generated during two of three cycles of the signal $S_4$ in response to which cycles the pedestal and top levels of the signal $S_4$ are respectively positioned. Further, the top level of the input signal and the reference cursor can be arbitrary displayed in either side of the divided screen, and the pedestal level and the delta cursor can be displayed in the opposite side.

Configurated as described above, the invention enables the reference and delta cursors to be precisely located on the pedestal and white levels of the input signal by enlarging the signal and simultaneously displaying the upper and lower portions thereof on the horizontally divided screen, thereby precisely measuring the differential level between the two cursors.

While the invention has been described in connection with what is presently considered to be most practical and preferred embodiments, it should be understood that the present invention is not limited to the disclosed embodiment, but on the contrary, is intended to cover various modifications and equivalent arrangements included within the spirit and scope of the appended claims.

What is claimed is:

1. A method for displaying a waveform of an input signal and reference and delta cursors for measuring the differences between pedestal and top levels of said input signal on a display screen, said method comprising the steps of:

generating a synchronization detecting pulse synchronously with a synchronous signal incorporated in said input signal;

generating a sweep signal synchronously with a sweep trigger signal obtained by dividing said synchronization detecting pulses by N, where N is a positive integer;

generating a cursor signal including two different voltage portions respectively corresponding to said reference and delta cursors;

multiplexing said input signal and cursor signal to provide a multiplexed input/cursor signal;

amplifying said multiplexed input/cursor signal at a given gain;

generating a vertical location arrangement signal to arrange reference display locations on a vertical axis for the waveform of said input signal and said reference and delta cursors, said vertical location arrangement signal being stepwise varied synchronously with said sweep trigger signal;

combining said vertical location arrangement signal and said multiplexed input/cursor signal which has been amplified with said gain to obtain a vertical axis drive signal;

driving a horizontal axis of said display screen on the basis of said sweep signal;

driving a vertical axis of said display screen on the basis of said vertical axis drive signal;

displaying at least two sliced portions of said waveform of said input signal with said references and delta cursors being displayed on the left and right sides of the same display screen in an enlarged/divided display mode (N≧2), or the whole waveform of said input signal on the display screen in a normal display mode (N=1); and displaying at least two sliced portions of said waveform of said input signal with said reference and delta cursors being displayed on the same display screen when N is increased.

* * * * *